(12) United States Patent
McBride

(10) Patent No.: US 7,239,143 B2
(45) Date of Patent: Jul. 3, 2007

(54) DIGITAL MAGNETIC RESONANCE GRADIENT PRE-EMPHASIS

(75) Inventor: Thomas R. McBride, Newbury, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 157 days.

(21) Appl. No.: 10/557,285

(22) PCT Filed: Apr. 19, 2004

(86) PCT No.: PCT/IB2004/001507

§ 371 (c)(1),
(2), (4) Date: Nov. 18, 2005

(87) PCT Pub. No.: WO2004/104613

PCT Pub. Date: Dec. 2, 2004

(65) Prior Publication Data

US 2006/0255807 A1    Nov. 16, 2006

Related U.S. Application Data

(60) Provisional application No. 60/472,024, filed on May 20, 2003.

(51) Int. Cl.
*G01V 3/00* (2006.01)
(52) U.S. Cl. .................. 324/322; 324/318
(58) Field of Classification Search ............. 324/322, 324/318, 319, 309, 307, 300; 600/410–422
See application file for complete search history.

(56) References Cited

U.S. PATENT DOCUMENTS

| | | | | |
|---|---|---|---|---|
| 5,349,296 A | * | 9/1994 | Cikotte et al. ............ 324/309 |
| 5,442,290 A | * | 8/1995 | Crooks ..................... 324/309 |
| 5,867,027 A | | 2/1999 | Kawamoto ................ 324/322 |
| 6,154,030 A | * | 11/2000 | Wurl ........................ 324/322 |
| 6,191,582 B1 | * | 2/2001 | Zur .......................... 324/307 |
| 6,285,304 B1 | * | 9/2001 | Schweighofer ........... 341/118 |
| 6,903,550 B2 | * | 6/2005 | Uetake ..................... 324/307 |

FOREIGN PATENT DOCUMENTS

| | | |
|---|---|---|
| EP | 0 307 516 A1 | 3/1989 |
| EP | 1 039 309 A1 | 9/2000 |
| JP | 2002-085369 | 3/2002 |

OTHER PUBLICATIONS

Bartusek, K., et al.; Applications of Digital Signal Processors in a Gradient Controller for MR Tomography; 2002; www.electronicsletters.com/papers/2002/0011/paper.

* cited by examiner

*Primary Examiner*—Brij B. Shrivastav

(57) ABSTRACT

A magnetic field gradient system includes a magnetic field gradient coil (20) and a magnetic field gradient amplifier (30) that operatively communicates with the magnetic field gradient coil (20). A pre-emphasis digital circuit (36) receives a digital magnetic field gradient control signal and outputs pre-emphasis correction terms. The preemphasis digital circuit includes a delay circuit (92) that delays the digital magnetic field gradient control signal by a selected time interval to produce a delayed digital magnetic field gradient control signal. A plurality of digital filters (110) each have selected time constant and amplitude parameters. The digital filters (110) receive the delayed digital magnetic field gradient control signal and output the pre-emphasis correction terms. A parameter memory (114) stores at least the time constant and amplitude parameters of the digital filters (110).

28 Claims, 4 Drawing Sheets

DIGITAL MAGNETIC RESONANCE GRADIENT PRE-EMPHASIS

CROSS REFERENCE TO RELATED APPLICATIONS

This application claims the benefit of U.S. provisional application Ser. No. 60/472,024 filed May 20, 2003, which is incorporated herein by reference.

The following relates to the diagnostic imaging arts. It finds particular application in magnetic resonance imaging. However, it also finds application in other technologies that employ precise magnetic field gradients.

Magnetic resonance imaging scanners typically employ a plurality of magnetic field gradient coils to selectively spatially encode magnetic resonances, to provide tagging in SPAMM-type imaging techniques, to spoil magnetic resonances, and the like. Image quality is dependent upon precise control of the magnetic field gradients. Pulse amplifier nonlinearities, signal propagation delays, eddy current effects, and other imperfections can adversely affect control of the magnetic gradients. Magnetic field gradient imperfections can produce imaging artifacts, reduced resolution, and other types of image degradation. Signal propagation delays produce a time lag between the input control signal and the output magnetic gradient which can cause errors in timing between the x-, y-, and z-gradients and between magnetic field gradients and radio frequency pulses. Changing gradient magnetic fields induce eddy currents that generate counteracting gradients. The eddy gradient fields are countered by introducing deliberate non-uniformities in the pulses, particularly an overshoot at the trailing end of the up and down ramps of the gradient pulses.

Pre-emphasis circuitry modifies the magnetic field gradient control signal to compensate for magnetic field gradient system imperfections and eddy current gradients. In the past, such pre-emphasis circuitry has generally taken the form of analog filtering, which involves a digital-to-analog conversion of the input signal before inputting to the analog pre-emphasis circuitry. The analog pre-emphasis circuitry topology is not readily modified, and introduction of temporal signal delays is not readily achieved. Large capacitors and potentiometers are used in the analog circuitry to provide a high pre-emphasis dynamic range, which increases cost and physical size of the pre-emphasis circuitry. Analog pre-emphasis correction can drift with temperature changes due to temperature dependence of the capacitors and other analog components. Shifts in analog component characteristics over time can also produce pre-emphasis drift.

The present invention contemplates an improved apparatus and method that overcomes the aforementioned limitations and others.

According to one aspect, a magnetic resonance imaging scanner is disclosed, including a magnetic field gradient system. The magnetic field gradient system includes a magnetic field gradient coil and a magnetic field gradient amplifier that operatively communicates with the magnetic field gradient coil. A pre-emphasis digital circuit receives a digital magnetic field gradient control signal and outputs pre-emphasis correction terms. The pre-emphasis digital circuit includes a delay circuit that delays the digital magnetic field gradient control signal by a selected time interval to produce a delayed digital magnetic field gradient control signal. A plurality of digital filters each have selected time constant and amplitude parameters. The digital filters receive the delayed digital magnetic field gradient control signal and output the pre-emphasis correction terms. A parameters memory stores at least the time constant and amplitude parameters of the digital filters.

According to another aspect, in a magnetic resonance imaging apparatus, a pre-emphasis digital circuit computes pre-emphasis correction terms for a digital magnetic field gradient control signal. A means is provided for delaying the digital magnetic field gradient control signal by a selected time interval to produce a delayed digital magnetic field gradient control signal. A means is provided for digitally filtering the delayed digital magnetic field gradient control signal. The filtering means implements plurality of filters a each having selected time constant and amplitude parameters. The filtering means receives the delayed digital magnetic field gradient control signal and outputs the pre-emphasis correction terms. A parameters memory means is provided for storing at least the time constant and amplitude parameters of the digital filtering means.

According to yet another aspect, a method is provided for controlling a magnetic field-generating coil of a magnetic resonance imaging scanner. A digital magnetic field gradient control signal is delayed by a selected time interval to produce a delayed digital magnetic field gradient control signal. The delayed digital magnetic field gradient control signal is digitally filtered. At least one coil control signal is constructed based on the delayed digital magnetic field gradient control signal and the digitally filtered delayed digital magnetic field gradient control signal. A magnetic field coil amplifier of the magnetic resonance imaging scanner is controlled using the coil control signal. The magnetic field coil amplifier energizes the magnetic field-generating coil based on the coil control signal.

One advantage resides in seamless integration of the pre-emphasis circuitry with other digital electronic components of a magnetic gradient system.

Another advantage resides in reduced sensitivity of the pre-emphasis circuitry to temperature changes and drift of component characteristics over time.

Yet another advantage resides in straightforward implementation of pre-emphasis cross-terms and shim terms.

Still yet another advantage resides in convenient introduction of selected time delays to the pre-emphasis. Independent time delays can be selected for each of the x-, y-, and z-gradient control signals.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

Figure 1:
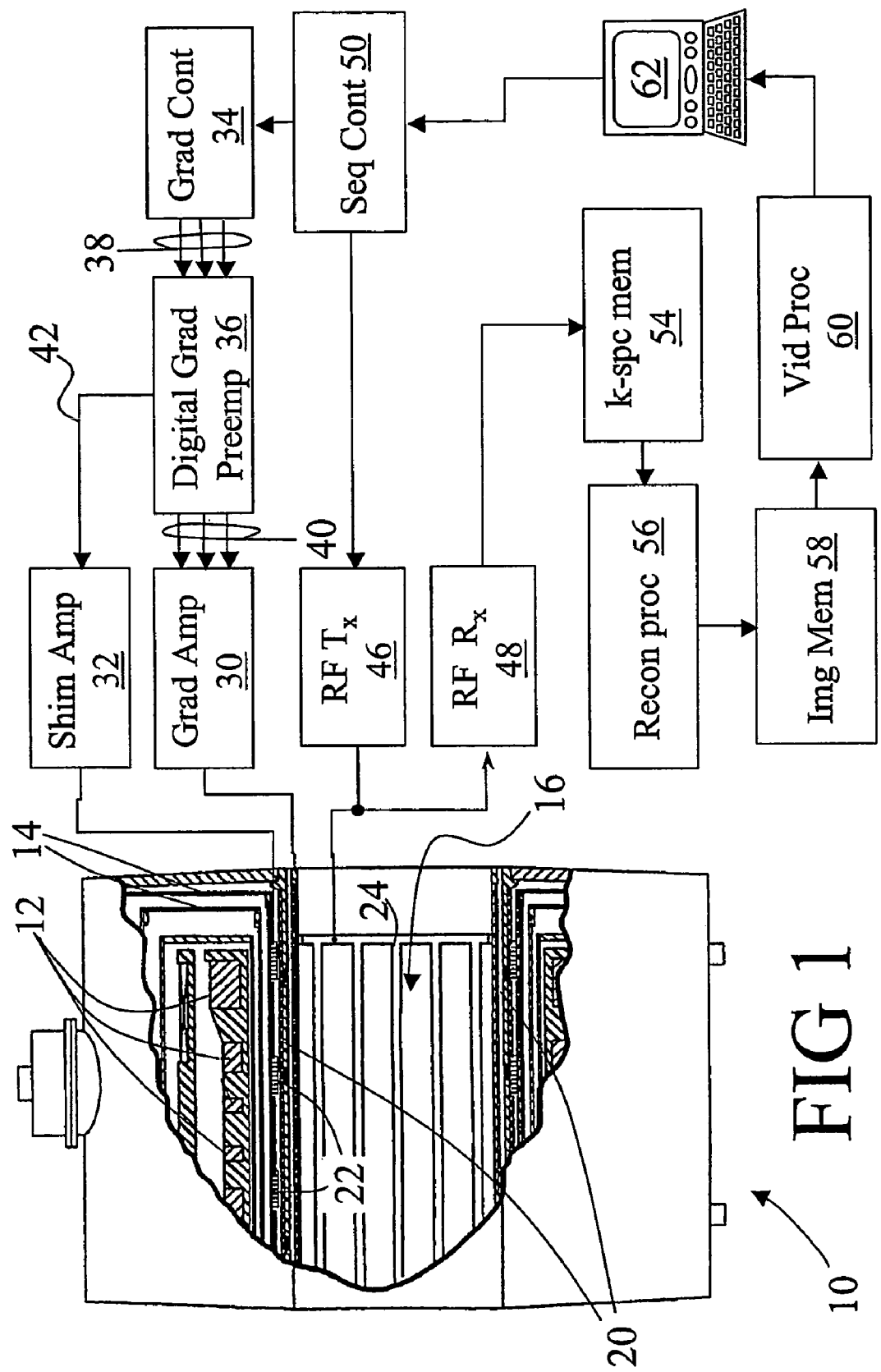
FIG. 1 shows a diagrammatic representation of a magnetic resonance imaging system.

With reference to FIG. 1, a magnetic resonance imaging scanner 10 includes a cylindrical main magnet assembly 12, which is preferably superconducting and includes cryoshrouding 14 to maintain the magnets 12 at a temperature below a superconductivity transition temperature of the magnets 12. The magnet assembly 12 and cryoshrouding 14 define a magnet bore 16 inside of which a patient or other imaging subject is placed for imaging. The main magnet 12 produces a spatially and temporally constant and uniform main magnetic field oriented along a longitudinal axis of the bore 16. Instead of a superconducting magnet, a non-superconducting magnet can be used. Moreover, a vertical magnet, an open magnet, or other type of main magnet can be employed instead of the illustrated horizontal cylindrical main magnet 12.

Magnetic field gradient coils 20 produce magnetic field gradients in the bore 16 for spatially encoding magnetic resonance signals, for producing magnetization-spoiling field gradients, or the like. Preferably, the magnetic field gradient coils 20 include coils configured to produce magnetic field gradients in three orthogonal directions including the longitudinal axial direction parallel to the main magnetic field. Shim coils 22 are preferably provided to improve uniformity of the main magnetic field, to stretch a field of view of the main magnetic field, or to otherwise modify magnetic fields within the bore 16. Although the shims 22 are shown arranged between the cryoshrouding 14 and the gradient coils 20, shims can be placed elsewhere within the bore 16. Optionally, the shim coils 22 are active coils, that is, coils which are selectively energized by a driving electrical current.

A whole body radio frequency coil assembly 24 generates radio frequency pulses for exciting magnetic resonances. The radio frequency coil assembly 24 also serves to detect magnetic resonance signals. Optionally, additional local radio frequency coils or phased radio frequency coil arrays (not shown) are included for exciting and/or detecting magnetic resonances at localized areas in the bore 16.

Gradient pulse amplifiers 30 deliver controlled electrical currents to the magnetic field gradient coils 20 to produce selected magnetic field gradients. Optionally, a shim coil pulse amplifier 32 selectively energizes the active shim coils 22. Magnetic field gradient controllers 34 control the pulse amplifiers 30, 32. Digital pre-emphasis circuitry 36 interposed between the magnetic field controllers 34 and the pulse amplifiers 30, 32 receives digital control signals 38 for the x-, y-, and z-gradients and computes modified digital control signal outputs 40 that control the gradient field pulse amplifiers 30. The pre-emphasis signal modifications compensate for eddy currents in the cryoshrouds 14 and elsewhere, speed limitations of the gradient amplifiers 30, signal delays or distortions, and the like. Optionally, an additional control signal 42 is output to control selective energizing of the active shim coils 22 to provide further compensation for magnetic field imperfections.

Each of the gradient coils of the three orthogonal directions (that is, pairs of coils that cooperatively produce transverse x- and y-directional gradients, and a gradient coil that produces longitudinal z-directional gradients) preferably has a corresponding gradient pulse amplifier 30 and magnetic field gradient controller 34 so that independent magnetic field gradients can be produced in the x-, y-, and z-directions.

A radio frequency transmitter 46, preferably digital, applies radio frequency pulses or pulse packets to the radio frequency coil assembly 24 to generate selected magnetic resonance excitations. A radio frequency receiver 48 also coupled to the radio frequency coil assembly 24 receives magnetic resonance signals. If more than one radio frequency coil is provided (such as a local coil or phased coil array), then different radio frequency coils are optionally used for the magnetic resonance excitation and detection operations.

To acquire magnetic resonance imaging data of a subject, the subject is placed inside the magnet bore 16, preferably at or near an isocenter of the main magnetic field. A sequence controller 50 communicates with the gradient controllers 34 and the radio frequency transmitter 46 to produce selected transient or steady state magnetic resonance configurations in the subject, to spatially encode such magnetic resonances, to selectively spoil magnetic resonances, or otherwise generate selected magnetic resonance signals characteristic of the subject. The generated magnetic resonance signals are detected by the radio frequency receiver 48, and are stored in a k-space memory 54. The imaging data is reconstructed by a reconstruction processor 56 to produce an image representation that is stored in an image memory 58. In one suitable embodiment the reconstruction processor 56 performs an inverse Fourier transform reconstruction.

The resultant image representation is processed by a video processor 60 and displayed on a user interface 62, which is preferably a personal computer, workstation, or other type of computer. Rather than producing a video image, the image representation can be processed by a printer driver and printed, transmitted over a computer network or the Internet, or the like. Preferably, the user interface 62 also allows a radiologist or other operator to communicate with the magnetic resonance sequence controller 50 to select magnetic resonance imaging sequences, modify imaging sequences, execute imaging sequences, and so forth.

Figure 2:
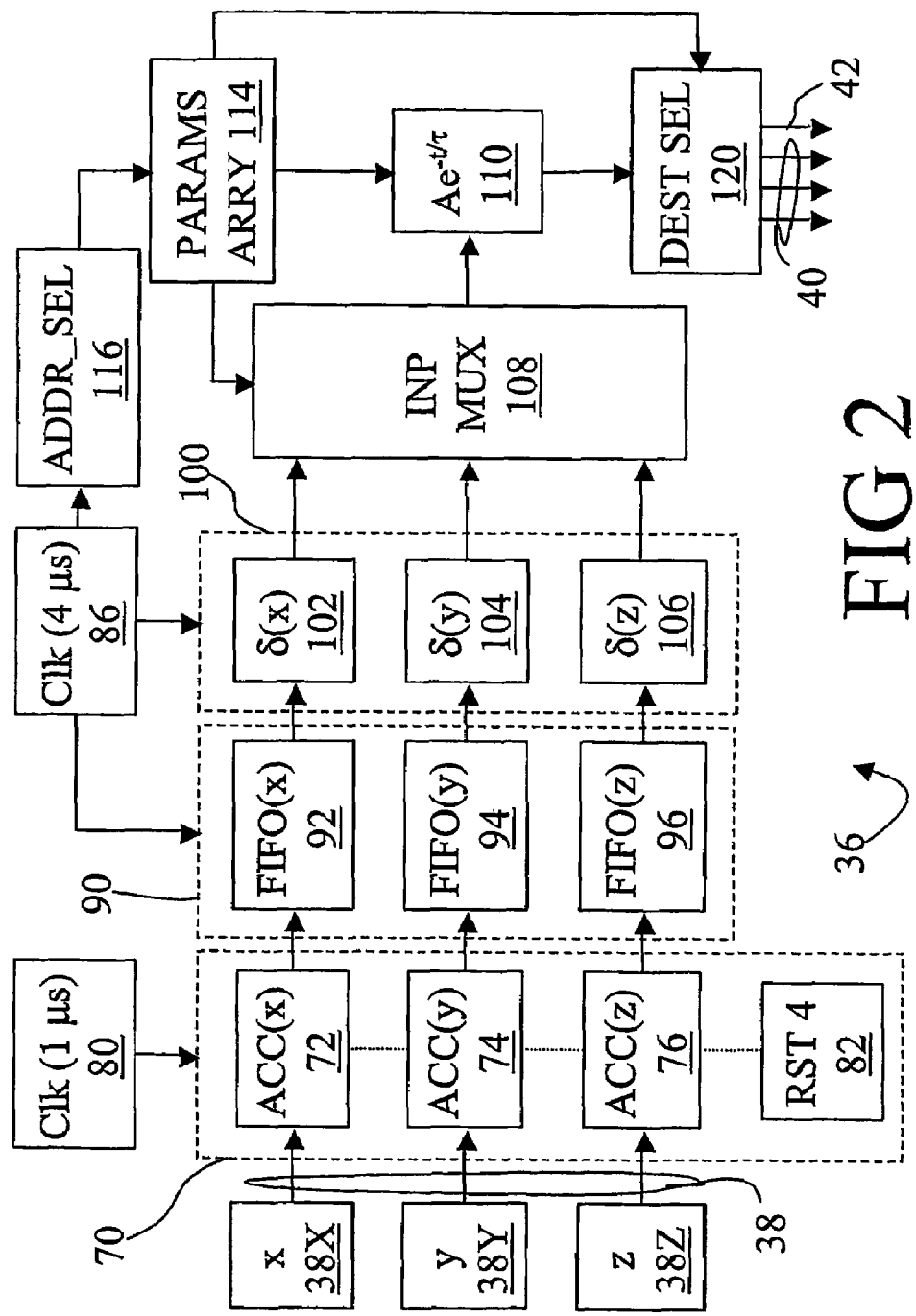
FIG. 2 shows a block diagram of the digital magnetic field gradient pre-emphasis circuit of FIG. 1.

With reference to FIG. 2, the digital pre-emphasis circuitry 36 receives input digital magnetic field gradient control signals 38. The signals 38 include an input x-gradient digital control signal 38Y, an input z-gradient digital magnetic field gradient control signal 38Z. In a preferred embodiment, the control signals 38X, 38Y, 38Z each have data rate of about 1 microsecond per digital sample, while the digital pre-emphasis circuitry 36 is clocked at a rate of 4 microseconds per processed digital sample. To account for the difference in speed, interpolation circuitry 70 includes accumulators 72, 74, 76 for accumulating digital data of the x-gradient control signal 38X, the y-gradient control signal 38Y, and the z-gradient control signal 38Z, respectively. The accumulators 72, 74, 76 are synchronously clocked by a first clock 80 to accumulate samples at the 1 microsecond per sample rate. A reset signal generator 82 produces a reset signal every four microseconds to reset the accumulators 72, 74, 76. The interpolation circuitry outputs interpolated data at a rate of 4 microseconds per interpolated sample.

These sample rates are exemplary only. Those skilled in the art can readily modify the interpolation circuitry 70 to accommodate other differences between the control signal digital sample rate and the pre-emphasis processing rate. For a given processing rate and a control signal sample rate that is an integer N times larger than the given processing rate, the reset signal generator 82 resets the accumulators 72, 74, 76 every N control signal samples. Moreover, those skilled in the art can readily substitute other interpolation circuitry that accommodates non-integer ratios between the control signal digital sample rate and the pre-emphasis processing rate.

A second clock 86 operates at the exemplary 4 microsecond interpolated sample processing rate, and synchronously times a remainder of the digital pre-emphasis circuitry 36. The interpolated data is input to digital time delay circuitry 90, which in a preferred embodiment includes three first in, first out (FIFO) buffers 92, 94, 96 corresponding to the x-, y-, and z-gradient control signals, respectively. Each FIFO 92, 94, 96 has a length selected to implement a selected time delay. For example, a FIFO with a length of three values provides (3 values)×(4 microseconds/sample)=12 microsecond delay. The output of the FIFO buffers 92, 94, 96 is a time-delayed digital magnetic field control signal. Advantageously, each of the FIFO buffers 92, 94, 96 can have a different length and consequently a different temporal delay. This enables each of the x-, y-, and z-gradient control signals to have a different and independent time delay. The time delays are selected, for example, to precisely synchronize the x-, y-, and z-gradients with one another and with radio frequency pulses output by the radio frequency transmitter 46. The FIFO buffers 92 are exemplary only; those skilled in the art can readily construct other digital delay circuits for use in the digital time delay circuitry 90.

The delayed digital magnetic control signals are processed by a high-pass filter set 100 to remove low-frequency components of the time-delayed gradient control signals. In a preferred embodiment, the high pass filters are delta filters. The time-delayed digital x-gradient control signal is processed by an x-gradient delta filter 102 that provides the transfer function $\delta(x[n])=x[n]-x[n-1]$, where n is the current sample index, n−1 is the previous sample index, x[n] is the current delayed x-gradient control signal sample, and x[n−1] is the previous delayed x-gradient control signal sample. Similarly, the time-delayed digital y-gradient control signal is processed by a y-gradient delta filter 104 that provides the transfer function $\delta(y[n])=7[n]-y[n-1]$, and the time-delayed digital z-gradient control signal is processed by a z-gradient delta filter 106 that provides the transfer function $\delta(z[n])=z[n]-z[n-1]$. The delta filters 102, 104, 106 are exemplary only. Those skilled in the art can readily construct other types of digital high pass filters for use in the digital high-pass filter set 100.

The high-pass filtered data is time-multiplexed by a multiplexor 108 into digital filtering circuitry 110. In a preferred embodiment, the digital filtering circuitry 110 implements an approximation of a linear combination of first order filters of the form $Ae^{-t/\tau}$, where A is a scaling constant and τ is a first order decay constant. A parameters storage 114 stores the parameters A and t for each first order filter. In a preferred embodiment, the parameters storage 114 includes filter amplitude A and decay time constant t parameters for each of the sixty-four first-order filters, as well as an input source parameter for each filter that specifies which input signal (x, y, or z) is processed by that filter. The input source parameter controls the multiplexor 108 to select the filter input. An address selector 116 cycles through the sixty-four filters at a rate sixty-four times faster than the 4 microsecond cycle of the second clock 86, so that each first-order filter is updated once per clock cycle of the second clock 86.

In addition to storing filter parameters A and t and the input source parameter for each of the sixty-four first-order filters, the parameters storage 114 further includes a destination parameter for each filter that controls destination selection circuitry 120. The destination parameter selects which gradient coil the filter output is applied to. Typically, the destination parameter is the same as the input source parameter, so that the filter adjusts the selected digital control signal 38X, 38Y, 38Z based on that control signal value. Optionally, the destination parameter is different from the input source parameter for one or more of the sixty-four filters, which provides a cross-term correction (for example, adjusting the y-gradient field based on the x-gradient field). The destination parameter can also be the shim control signal 42 which provides active shim control. Additionally, the destination parameter can be a null parameter, such that the filter output is unused.

The outputs of the sixty-four filters selectably modify the time-delayed control signals output by the digital time delay circuitry 90. The filters are selectably combinable to define selected linear combinations of correction term values that are used to produce the modified digital control signal outputs 40 that are applied to the gradient coil pulse amplifiers 30. If active shims 22 are to be incorporated into the pre-emphasis corrections, then a shim control signal 42 is also suitably generated by combining one or more selected pre-emphasis terms. The optional shim control signal 42 is used to control the shim pulse amplifier 32.

The programmable parameters contained in the parameters storage 114, coupled with the multiplexor 108, enable the digital filtering circuitry 110 to embody a plurality (such as sixty-four) first-order digital filters using one digital signal processing pipeline. These first-order digital filters can be combined into various linear combinations that are applied to the time-delayed x-, y-, or z-gradient control signals. Additionally, selected linear combinations can be used to construct a control signal that is applied to the shim coil 22. Rather than time-domain multiplexing the delayed x-, y-, and z-gradient control signals through a single digital filtering pathway, separate filtering circuitry pathways can be provided for the time-delayed x-, y-, and z-gradient control signals, so that the signals are processed in parallel. Moreover, for further increased speed, the components of the linear combination of filters that provide pre-emphasis for a given x-, y-, z-, or shim gradient coil can be computed using separate digital signal processing pipelines. More destination to support more shim coils can be added.

Figure 3:
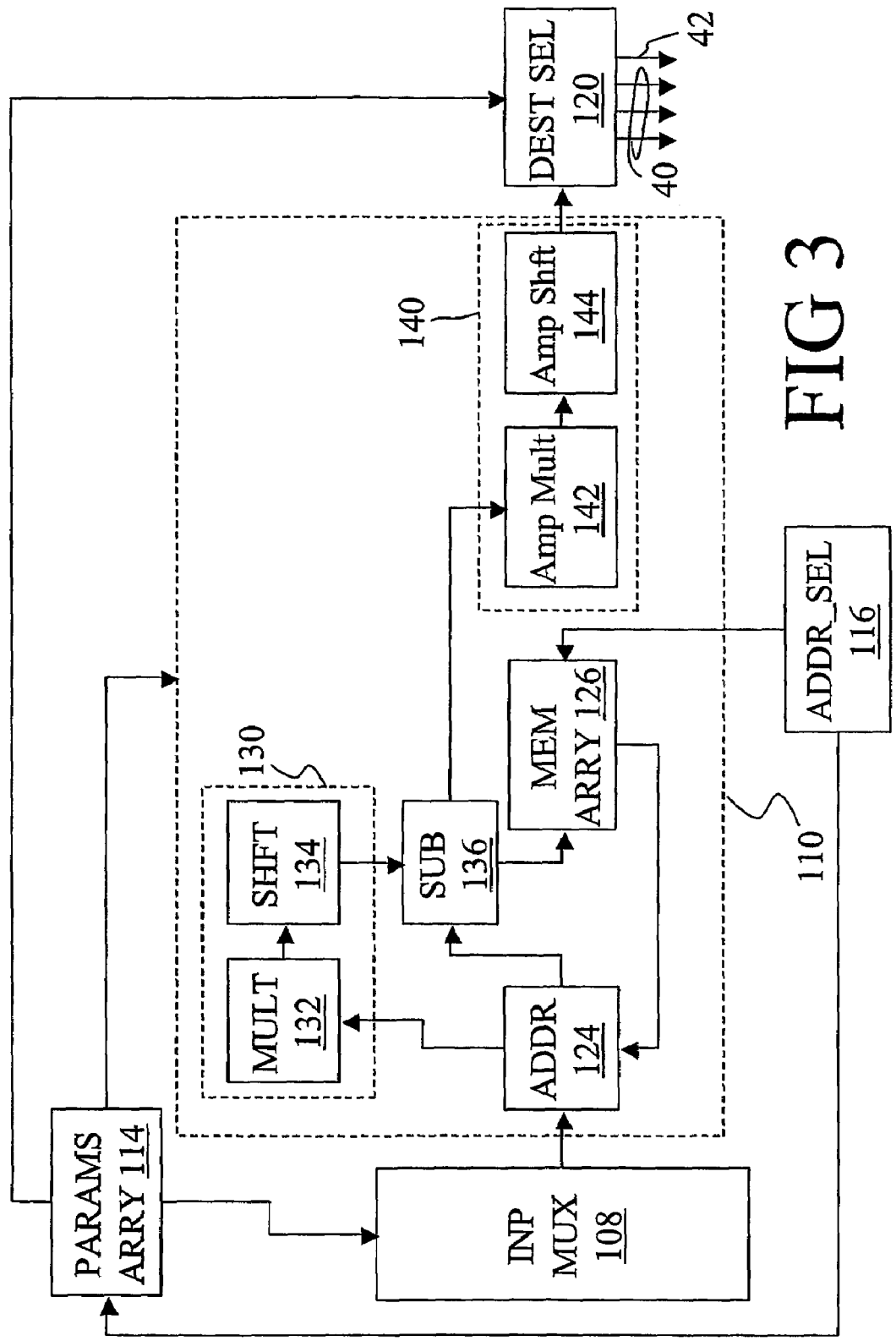
FIG. 3 shows a block diagram of the digital filtering portion of the pre-emphasis circuit of FIG. 2.

With reference to FIG. 3, in a preferred embodiment the digital filtering circuitry 110 approximates the floating point amplitude scaling and exponential decay operations of the first order filters $Ae^{-t/\tau}$ using a combination of bit-shift and multiplication operations. An adder 124 adds the output of the multiplexor 108 to a last pass value that is stored in an addressed element of a sixty-four element memory array 126. The memory array 126 includes a one-element storage space for each of the sixty-four pre-emphasis correction terms for use in iterative computing of the exponential decay. The elements of the memory array 126 are accessed in synch with the addressing of the sixty-four filters using the address selector 116. Although shown as separate elements, it is contemplated to integrate the memory array 126 into the parameters array 114.

An exponential decay estimator 130 including a multiplier 132 and a bit-shifter 134 approximates an exponential decay in piecewise fashion. In a preferred embodiment, improved temporal resolution is obtained by having the multiplier 132 scale the output of the adder 124 by a factor ranging between one-fourth and one, followed by a selected bit-shifting by the shifter 134. Each bit shift corresponds to a division by four. In a suitable embodiment, the bit-shifter 134 shifts between zero and fourteen bit positions in steps of two bits. Parameters for the multiplier 132 and the bit-shifter 134 for the decay constant of the addressed pre-emphasis correction term are supplied by the parameters storage 114. The output of the bit-shifter 134 is removed from the output of the adder 124 by a subtractor 136, and the difference is stored in the addressed element of the memory array 126 for use in the next pass. In this manner, an approximately exponential decay toward zero is effected by iteratively piecewise subtracting from the signal.

Scaling circuitry 140 scales the value by the factor A of the first order filter $Ae^{-t/\tau}$. Preferably, the scaling circuitry 140 is also implemented using a combination of an amplitude multiplier 142 and an amplitude bit-shifter 144. Again, the parameters for the scaling circuitry 140 are supplied by the parameters storage 114. In a preferred embodiment, the scaling factor A can be either positive or negative. This allows for pre-emphasis control of both gradient field undershoots and gradient field overshoots. The scaled output is applied to the appropriate gradient via the destination selector 120.

The digital filtering components shown in FIG. 3 are exemplary only. Those skilled in the art can readily modify the illustrated components or construct other types of first order digital filters for use in the digital filtering circuitry 110. Moreover, although circuitry implementing first-order filter components is illustrated, it is also contemplated to employ higher order digital filters.

Figure 4:
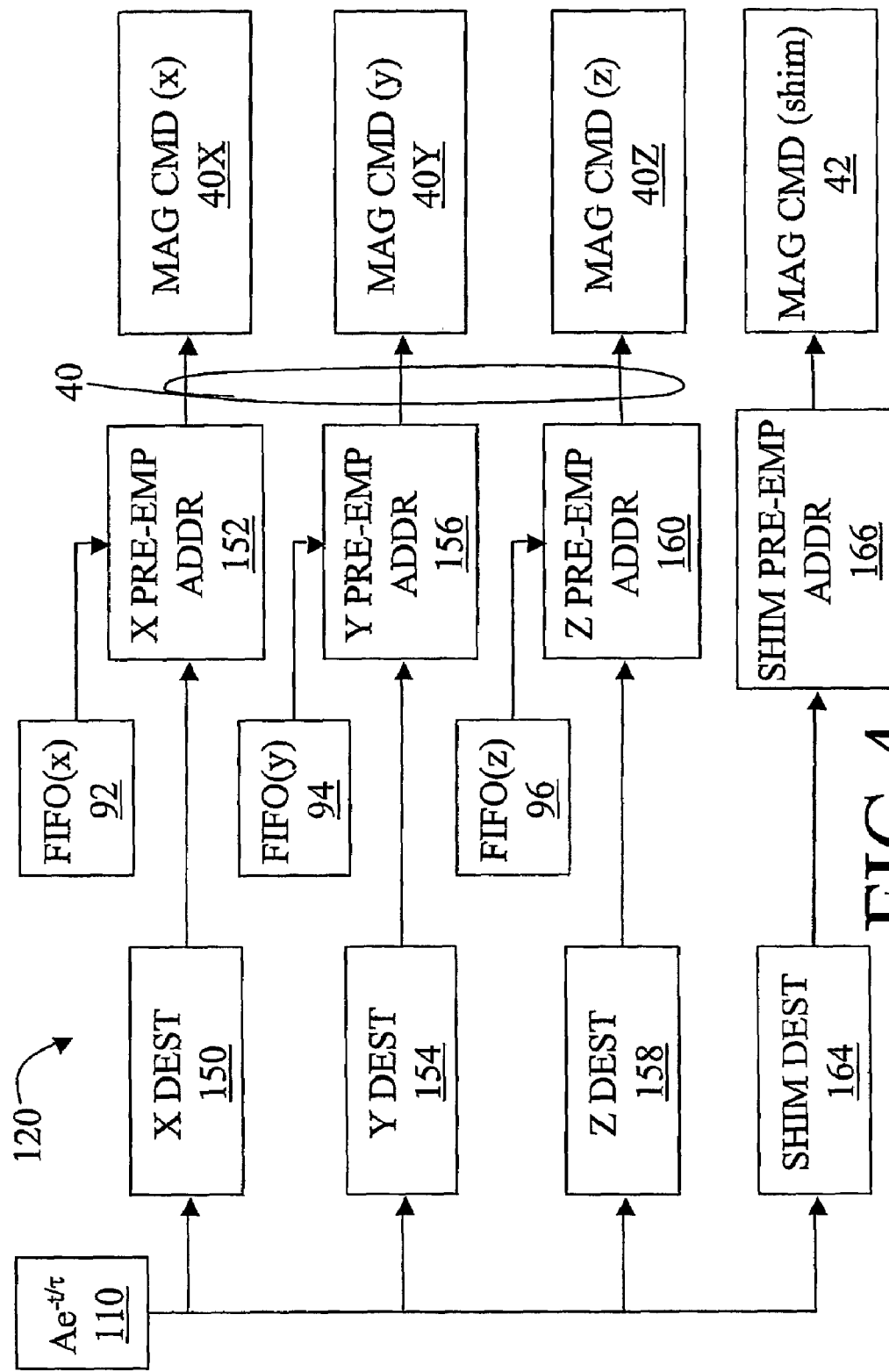
FIG. 4 shows a block diagram of the destination selection portion of the pre-emphasis circuit of FIG. 2.

With reference to FIG. 4, the pre-emphasis correction terms are applied to the time delayed control signals output by the FIFO buffers 92, 94, 96 by the destination selection circuitry 120 to produce modified control signals 40, which for a gradient coil system that provides x-, y-, and z-gradients include a modified x-gradient control signal 40X, a modified y-gradient control signal 40Y, and a modified z-gradient control signal 40Z.

An x-gradient destination selector 150 selects correction terms which are to be applied to the x-gradient control signal. An x-gradient pre-emphasis add-in circuit 152 additively applies the selected correction terms to the time-delayed x-gradient digital magnetic field gradient control signal output by the FIFO buffer 92 to produce the modified x-gradient digital magnetic field gradient control signal 40X. Similarly, a y-gradient destination selector 154 selects y-gradient correction terms, and a y-gradient pre-emphasis add-in circuit 156 additively applies the selected correction terms to the time-delayed y-gradient control signal output by the FIFO 94. A z-gradient destination selector 158 selects z-gradient correction terms, and a z-gradient pre-emphasis add-in circuit 160 additively applies the selected correction terms to the time-delayed z-gradient control signal output by the FIFO 96.

An advantage of using digital circuitry in computing and applying pre-emphasis correction terms is that it enables straightforward inclusion of pre-emphasis cross-terms. For example, an x-gradient can induce eddy currents in the cryoshrouding 14 or elsewhere which affect the y- or z-gradient fields. A pre-emphasis cross-term adjusts the affected y- or z-gradient control signal based on the x-gradient. A cross-term correcting the y-gradient for eddy currents produced by the x-gradient, for example, is readily implemented by computing the cross-term correction using the digital filtering circuitry 110 with the input source parameter set to the time-delayed x-gradient control signal, and setting the destination parameter for that filter to the y-gradient control signal.

In a similar fashion, correction terms are optionally applied to the active shim coil 22. A shim destination selector 164 selects zero or more correction terms computed from the x-, y-, or z-gradient control signals, and a shim pre-emphasis add-in circuit 166 additively combines the selected zero or more correction terms to compute a pre-emphasis control signal applied to the shim coil pulse amplifier 32. Such a shim pre-emphasis control signal can be employed where, for example, energizing the active shim coil 22 compensates for magnetic field gradient imperfections more effectively than does a pre-emphasis modification of the x-, y-, or z-gradient control signal. Although a single shim control signal 42 is output by the destination selection circuitry 120, those skilled in the art can readily modify the circuitry 120 to produce additional control signals for controlling additional active shims.

The digital gradient pre-emphasis circuitry 36 can be implemented as a programmable logic chip and related digital circuitry that is disposed on a dedicated electronics board. Alternatively, the pre-emphasis circuitry 36 can be physically integrated with the gradient controllers 34 or the gradient amplifiers 30, 32.

To apply the pre-emphasis circuitry 36, suitable filtering parameters are selected by calibrating using a phantom. Calibration methods used in conjunction with existing analog pre-emphasis circuitry are readily adapted to calibrating the digital gradient pre-emphasis circuitry 36. In the case of analog circuitry, analog pots are adjusted to change filtering parameters. In the case of the digital gradient pre-emphasis circuitry 36, contents of the parameters storage 114 are edited to effect the calibration. To calculate pre-emphasis cross-terms (for example, a pre-emphasis correction term applied to the y-gradient control signal responsive to an x-gradient control signal) the corresponding gradients can be ramped. In one suitable approach, an echo-planar imaging (EPI) scan is repeatedly executed. For certain repeated EPI sequences, imaging errors accumulate, and the pre-emphasis cross-terms are suitably adjusted to minimize such accumulated errors.

The pre-emphasis calibration terms stored in the parameters storage array 114 typically are not predictable enough to enable presetting the values. Rather, field calibration using phantoms and iterative adjustment as discussed above is preferably employed. However, in cases where suitable filtering parameters can be pre-calculated based on modeling, or estimated based on prior experience with similar magnetic resonance imaging scanners, these pre-calculated or estimated values are preferably pre-loaded into the parameters storage 114 to provide a close starting point for calibration using phantoms. In addition to filtering parameters A and $\tau$ of the first order filters $Ae^{-t/\tau}$, other parameters such as buffer lengths of the FIFO buffers 92, 94, 96, and destination designation parameters for programming the digital signal processing topology implemented by the destination selectors 150, 154, 158, 164, are optionally stored in the parameters storage 114 to further enhance programmability of the digital pre-emphasis circuitry 36.

After calibration, the pre-emphasis terms are applied by the pre-emphasis circuitry 36 during imaging to reduce distortions caused by signal delays, high frequency control signal distortions, eddy currents, and the like. In another application, the active shim coils 22 can be energized using the pre-emphasis control signal 42 to compensate for frequency errors in the radio frequency components. The resonance frequency is determined by the main ($B_o$) field; hence, small errors in the frequency of the radio frequency excitation pulses produced by the radio frequency transmitter 46 can be corrected by actively shimming the main $B_o$ magnetic field using the active shims 22 controlled by the pre-emphasis control signal 42. Also, errors in $B_o$ can be corrected by modifying the frequency of the radio frequency section.

The invention has been described with reference to the preferred embodiments. Obviously, modifications and alterations will occur to others upon reading and understanding the preceding detailed description. It is intended that the invention be construed as including all such modifications Having described the referred embodiments, the invention is now claimed to be:

1. A magnetic resonance imaging scanner having a magnetic field gradient system including:
    a magnetic field gradient coil;
    a magnetic field gradient amplifier operatively communicating with the magnetic field gradient coil; and
    a pre-emphasis digital circuit that receives a digital magnetic field gradient control signal and outputs pre-emphasis correction terms, the pre-emphasis digital circuit including:
        a delay circuit that delays the digital magnetic field gradient control signal by a selected time interval to produce a delayed digital magnetic field gradient control signal,
        a plurality of digital filters each having selected time constant and amplitude parameters, the digital filters receiving the delayed digital magnetic field gradient control signal and outputting the pre-emphasis correction terms, and
        a parameters memory that stores at least the time constant and amplitude parameters of the digital filters.

2. The magnetic resonance imaging scanner as set forth in claim 1, wherein the pre-emphasis digital circuit is integrated with electronics of the magnetic field gradient amplifier.

3. The magnetic resonance imaging scanner as set forth in claim 1, wherein the pre-emphasis digital circuit further includes:
    a second delay circuit that delays a second digital magnetic field gradient control signal by a second selected time interval to produce a second delayed digital magnetic field gradient control signal; and
    a multiplexor that time domain multiplexes the delayed digital magnetic field gradient control signal and the second delayed digital magnetic field gradient control signal into the plurality of digital filters.

4. The magnetic resonance imaging scanner as set forth in claim 3, wherein the pre-emphasis digital circuit further includes:
    a destination selection circuit that selectively combines the pre-emphasis correction terms with the delayed digital magnetic field gradient control signal and the second delayed digital magnetic field gradient control signal to produce a modified delayed digital magnetic field gradient control signal and a modified second delayed digital magnetic field gradient control signal, respectively.

5. The magnetic resonance imaging scanner as set forth in claim 1, wherein the pre-emphasis digital circuit further includes:
    an adder circuit that additively combines the pre-emphasis correction terms and the delayed digital magnetic field gradient control signal, the output of the adder circuit controlling the magnetic field gradient amplifier.

6. The magnetic resonance imaging scanner as set forth in claim 1, wherein the pre-emphasis digital circuit further includes:
    a plurality of destination selection circuits that selectively combine the pre-emphasis correction terms, the delayed digital magnetic field gradient control signal, and at least one other delayed digital magnetic field gradient control signal to compute a plurality of control signals for controlling a plurality of coil amplifiers.

7. The magnetic resonance imaging scanner as set forth in claim 1, wherein the pre-emphasis digital circuit further includes:
    a high-pass filter that filters the delayed digital magnetic field gradient control signal, the high-pass filtered delayed digital magnetic field gradient control signal being input to the digital filters.

8. The magnetic resonance imaging scanner as set forth in claim 7, wherein the high pass filter is a delta filter.

9. The magnetic resonance imaging scanner as set forth in claim 1, wherein the delay circuit includes:
    a first-in, first-out buffer having a buffer length corresponding to the selected time interval.

10. The magnetic resonance imaging scanner as set forth in claim 1, wherein the plurality of digital filters are first-order digital filters that include:
    an exponential decay calculator that computes an exponential decay value based on the delayed digital magnetic field gradient control signal; and
    a subtractor that subtracts the exponential decay value from the delayed digital magnetic field gradient control signal.

11. The magnetic resonance imaging scanner as set forth in claim 10, wherein the exponential decay calculator includes:
    a multiplier; and
    a bit shifter;
    the multiplier and the bit shifter cooperatively computing the exponential decay value.

12. The magnetic resonance imaging scanner as set forth in claim 10, wherein the plurality of first-order digital filters further include:
    a scaling circuit that scales an amplitude of the subtractor output.

13. The magnetic resonance imaging scanner as set forth in claim 12, wherein the scaling circuit includes:
    an amplitude multiplier; and
    an amplitude bit shifter;
    the amplitude multiplier and the amplitude bit shifter cooperatively effecting the amplitude scaling.

14. The magnetic resonance imaging scanner as set forth in claim 1, further including:
    a shim coil;
    a shim coil amplifier operatively communicating with the shim coil; and
    a destination selection circuit that selectively applies the pre-emphasis correction terms to the shim coil amplifier.

15. The magnetic resonance imaging scanner as set forth in claim 1, wherein the digital magnetic field gradient control signal has a first sample rate, and a portion of the pre-emphasis digital circuit operates at a second sample rate that is less than the first sample rate, the pre-emphasis digital circuit further including:
    an interpolator that combines samples of the digital magnetic field gradient control signal and outputs an interpolated control signal with the second sample rate.

16. The magnetic resonance imaging scanner as set forth in claim 15, wherein the first sample rate is an integer N times larger than the second sample rate, and interpolator includes:
    an accumulator that accumulates N samples to compute the interpolated control signal.

17. In a magnetic resonance imaging apparatus, a pre-emphasis digital circuit for computing pre-emphasis correction terms for a digital magnetic field gradient control signal, the pre-emphasis digital circuit including:

a means for delaying the digital magnetic field gradient control signal by a selected time interval to produce a delayed digital magnetic field gradient control signal;

a means for digitally filtering the delayed digital magnetic field gradient control signal, the filtering means implementing plurality of filters a each having selected time constant and amplitude parameters, the filtering means receiving the delayed digital magnetic field gradient control signal and outputting the pre-emphasis correction terms; and a parameters memory means for storing at least the time constant and amplitude parameters of the digital filtering means.

18. The pre-emphasis digital circuit as set forth in claim 17, wherein the digital magnetic field gradient control signal includes at least two digital magnetic field gradient control signals, the delay means produces a plurality of delayed digital magnetic field gradient control signals corresponding to the at least two digital magnetic field gradient control signals, and the pre-emphasis digital circuit further includes:

a multiplexing means for selectably inputting the plurality of delayed digital magnetic field gradient control signals to the filtering means to produce the pre-emphasis correction terms; and a selecting means for selectably applying the pre-emphasis correction terms to selected magnetic field-generating means.

19. The pre-emphasis digital circuit as set forth in claim 17, wherein the delay means includes:

a synchronous digital storage means for storing each sample of the digital magnetic field gradient control signal for a selected number of clock cycles corresponding to selected time interval, after which the synchronous digital storage means outputs the sample.

20. The pre-emphasis digital circuit as set forth in claim 19, wherein the synchronous digital storage means includes a first in, first out circuit.

21. The pre-emphasis digital circuit as set forth in claim 17, wherein the digital filtering means implements first order digital filters, the digital filtering means including:

an exponential decay means for effecting an exponential decay of the delayed digital magnetic field gradient control signal; and an amplitude scaling means for effecting an amplitude scaling of the delayed digital magnetic field gradient control signal.

22. A method for controlling a magnetic field-generating coil of a magnetic resonance imaging scanner, the method including:

delaying a digital magnetic field gradient control signal by a selected time interval to produce a delayed digital magnetic field gradient control signal;

digitally filtering the delayed digital magnetic field gradient control signal;

constructing at least one coil control signal based on the delayed digital magnetic field gradient control signal and the digitally filtered delayed digital magnetic field gradient control signal; and controlling a magnetic field coil amplifier of the magnetic resonance imaging scanner using the coil control signal, the magnetic field coil amplifier energizing the magnetic field-generating coil based on the coil control signal.

23. The method as set forth in claim 22, wherein the delaying includes:

storing each sample of the digital magnetic field gradient control signal in a clocked memory; and releasing the stored sample from the clocked memory after a number of clock cycles selected to correspond to the selected time interval.

24. The method as set forth in claim 22, wherein the delaying includes:

passing the digital magnetic field gradient control signal through a clocked first in, first out buffer having a buffer length corresponding to the selected time interval.

25. The method as set forth in claim 22, wherein the digital filtering includes:

multiplying each sample of the delayed digital magnetic field gradient control signal by an exponential factor to produce a subtractive decay portion; and subtracting the subtractive decay portion from the delayed digital magnetic field gradient control signal.

26. The method as set forth in claim 25, wherein the multiplying by an exponential factor includes:

multiplying the sample by an integer to produce an intermediate value; and bit-shifting one of the sample and the intermediate value by a selected number of bit positions to effect a division by a power of 2.

27. The method as set forth in claim 22, further including:

digitally interpolating the digital magnetic field gradient control signal at a first clock rate to produce an interpolated digital magnetic field gradient control signal at a second clock rate that is slower than the first clock rate; and performing the delaying and the digital filtering on the interpolated digital magnetic field gradient control signal at the second clock rate.

28. The method as set forth in claim 22, wherein the controlling of a magnetic field coil amplifier of the magnetic resonance imaging scanner using the coil control signal includes:

applying the coil control signal to a shim coil amplifier.

* * * * *